United States Patent
Averill et al.

(10) Patent No.: US 7,865,854 B2
(45) Date of Patent: Jan. 4, 2011

(54) SIMULTANEOUS PARAMETER-DRIVEN AND DETERMINISTIC SIMULATION WITH OR WITHOUT SYNCHRONIZATION

(75) Inventors: Duane A. Averill, Rochester, MN (US); Christopher T. Phan, Rochester, MN (US); Corey V. Swenson, Rochester, MN (US); Sharon D. Vincent, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 428 days.

(21) Appl. No.: 12/108,145

(22) Filed: Apr. 23, 2008

(65) Prior Publication Data

US 2009/0271165 A1 Oct. 29, 2009

(51) Int. Cl.
*G06F 17/50* (2006.01)
*G06F 9/45* (2006.01)

(52) U.S. Cl. ............... 716/5; 716/4; 716/6; 716/18; 703/13; 703/14; 710/5; 710/6; 710/7; 710/20; 710/21; 710/58; 710/59; 710/60; 710/61; 710/260; 710/261; 710/262; 710/263; 714/724; 714/728; 714/738; 714/739; 714/740; 714/741

(58) Field of Classification Search ............... 716/4–6, 716/18; 703/13–14; 710/5–7, 20–21, 58–61, 710/260–263; 714/724, 728, 738–741
See application file for complete search history.

(56) References Cited

U.S. PATENT DOCUMENTS

| 7,316,006 B2* | 1/2008 | Cook et al. ............... 717/135 |
| 2004/0249618 A1* | 12/2004 | Fine et al. .................... 703/2 |
| 2005/0086565 A1* | 4/2005 | Thompson et al. ......... 714/741 |

OTHER PUBLICATIONS

IBM, Method for Combining and Controlling Manual and Random Stimulus, Sep. 30, 2004.

* cited by examiner

*Primary Examiner*—Nghia M Doan
(74) *Attorney, Agent, or Firm*—Cantor Colburn LLP (57) ABSTRACT

A method for allowing simultaneous parameter-driven and deterministic simulation during verification of a hardware design, comprising: enabling a plurality of random parameter-driven commands from a random command generator to execute in a simulation environment during verification of the hardware design through a command managing device; and enabling a plurality of deterministic commands from a manually-driven testcase port to execute in the simulation environment simultaneously with the plurality of random parameter-driven commands during verification of the hardware design through the command managing device, the plurality of deterministic commands and the plurality of random parameter-driven commands each verify the functionality of the hardware design.

15 Claims, 4 Drawing Sheets

FIG. 4

SIMULTANEOUS PARAMETER-DRIVEN AND DETERMINISTIC SIMULATION WITH OR WITHOUT SYNCHRONIZATION

BACKGROUND OF THE INVENTION

1. Field of the Invention

This invention relates to a system and method for allowing simultaneous parameter-driven random command execution and deterministic testcase execution with or without synchronization control during verification of a hardware design.

2. Description of Background

In a robust simulation verification environment, there are both parameter-driven, randomly generated test scenarios as well as deterministic or targeted test scenarios that are used to verify the full functionality of a hardware design. Targeted or deterministic test scenarios are used to verify "hard-to-hit" corner cases or specialized function in the design. Parameter-driven, randomly on-the-fly stimulus is used to verify the majority of the test scenarios and to provide higher test coverage for the design.

Previously, targeted tests were performed as isolated test scenarios without the random on-the-fly traffic generation that would normally be present in the actual system environment. In addition, random on-the-fly generated test scenarios were exercised separately from targeted scenarios. At least one drawback from this approach is that because of separation of the two environments, possible bugs that could result in a specialized or targeted test scenario interacting with random on-the-fly generated scenarios in the environment could go undetected in the simulation environment. Also, there was no way for manual testcases to modify or disable the random command generation in the environment.

Previous attempts to combine the two paradigms involved creating a random testcase command and introducing such command into the environment using the same testcase port that was used to introduce manual stimulus. The drawback to this approach is that the manual nature of the testcases that included this random stimulus. The randomization parameters were required to be specified within the testcase file and if the randomization needed to change, the testcases were required to be updated. In addition, if different randomization biases were desired, multiple copies of the same manual testcase with different randomization parameters would need to be created and maintained.

The above-mentioned approach could not support synchronization control that is often included in targeted testcases within a random parameter-driven on-the-fly execution environment. In the past, parameter-driven testcases and testcase port driven manual or random testcases were treated as separate simulation environments.

Furthermore, the targeted or deterministic testcases with or without random stimulus within the testcase did not get continued runtime exposure that other random parameter-driven testcases received since they were not included in the random parameter-driven regression suite.

SUMMARY OF THE INVENTION

The shortcomings of the prior art are overcome and additional advantages are provided through the provision of a method for allowing simultaneous parameter-driven and deterministic simulation during verification of a hardware design, the method comprising: enabling a plurality of random parameter-driven commands from a random command generator to execute in a simulation environment during verification of the hardware design through a command managing device; and enabling a plurality of deterministic commands from a manually-driven testcase port to execute in the simulation environment simultaneously with the plurality of random parameter-driven commands during verification of the hardware design through the command managing device, the plurality of deterministic commands and the plurality of random parameter-driven commands each verify the functionality of the hardware design.

The shortcomings of the prior art are overcome and additional advantages are further provided through the provision of a system for allowing simultaneous parameter-driven and deterministic simulation during verification of a hardware design under test, the system comprising: a command managing device configured to manage the simultaneous execution of a plurality of random parameter-driven commands and a plurality of deterministic commands in a simulation environment during verification of the hardware design under test; a random command generator that operably interacts with the command managing device, the random command generator generates the plurality of random parameter-driven commands; and a manually-driven testcase port that operably interacts with the command managing device, the manually-drive testcase port generates the plurality of deterministic commands.

The shortcomings of the prior art are overcome and additional advantages are even further provided through the provision of a system for allowing simultaneous parameter-driven and deterministic simulation during verification of a hardware design under test, the apparatus comprising: a command managing device configured to manage the simultaneous execution of a plurality of random parameter-driven commands and a plurality of deterministic commands in a simulation environment during verification of the hardware design under test; a random command generator that operably interacts with the command managing device, the random command generator generates the plurality of random parameter-driven commands; a manually-driven testcase port that operably interacts with the command managing device, the manually-driven testcase port generates the plurality of deterministic commands; a parameter file in signal communication with the command managing device, the parameter file includes random biasing stimuli for modifying or manipulating the plurality of random parameter-driven commands in the simulation environment independently from the plurality of deterministic commands without interrupting the execution of the plurality of deterministic commands; and a testcase file having instructions that are read and decoded by the manually-driven testcase port for generating the deterministic commands.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution for allowing simultaneous parameter-driven random command execution and deterministic testcase execution with or without synchronization control during verification of a hardware design.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

The present invention and the various features and advantageous details thereof are explained more fully with reference to the non-limiting embodiments that are illustrated in the accompany drawings and detailed in the following description. It should be noted that the features illustrated in the drawings are not necessarily drawn to scale. Descriptions of well-known or conventional components and processing techniques are omitted so as to not necessarily obscure the present invention in detail. The examples used herein are intended merely to facilitate an understanding of ways in which the invention may be practiced and to further enable those of skill in the art to practice the invention. Accordingly, the examples should not be construed as limiting the scope of the invention.

Exemplary embodiments of the present invention generally provide a system and method for allowing simultaneous parameter-driven random command execution and targeted or deterministic testcase execution (with or without synchronization control) during verification of a hardware design (e.g., integrated device). The inventors herein have recognized that rather than requiring the deterministic or targeted test scenarios (with or without synchronization control) to be exercised in an isolated simulation environment without parameter-driven on-the-fly randomly generated traffic, exemplary embodiments of the present invention will allow the targeted test scenarios to execute along with the parameter-driven random on-the-fly generated stimulus in a simulation environment.

As used herein "commands" is intended to describe both deterministic commands and random parameter-driven commands unless the context in which "commands" is placed is directed to one of the two types of commands (deterministic or random parameter-driven).

Figure 1:
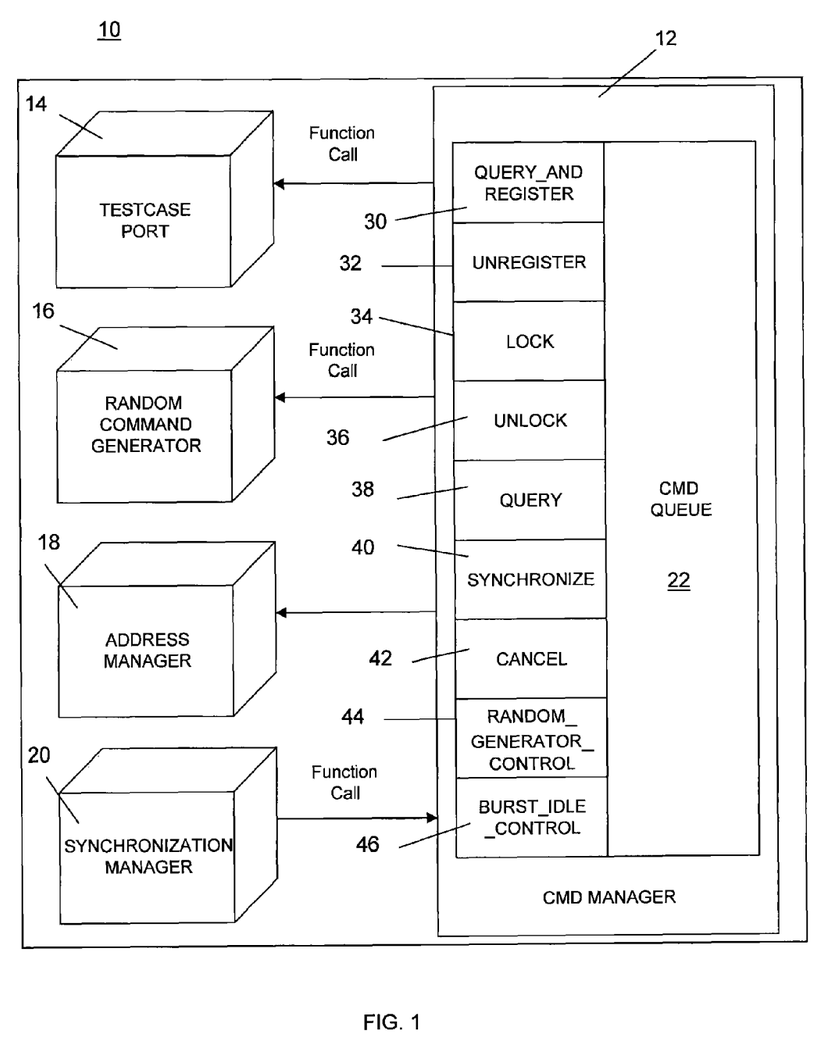
FIG. 1 illustrates various operational blocks that exist in a simulation environment in accordance with one exemplary embodiment of the present invention.

For a better understanding of the invention and its operation, turning now to the drawings, FIG. 1 is a schematic diagram illustrating the basic elements of one exemplary embodiment of the present invention. More specifically, FIG. 1 illustrates command manager architecture in interaction with other operational blocks within the simulation environment 10 in accordance with one exemplary embodiment of the present invention. The simulation environment 10 generally comprises a command manager or command managing device 12 contained within a bus functional model (BFM) that operably interacts with or functionally calls out to a BFM-specific test case port 14, a BFM-specific random command generator 16, a dynamic address manager 18 that exists within the simulation environment but outside of the BFM in accordance with one exemplary embodiment, and a synchronization manager 20 that also exists within the simulation environment but outside of the BFM in accordance with one exemplary embodiment.

In accordance with one exemplary embodiment, the command manager 12 interacts or functionally calls out to the testcase port 14 for deterministic testcase scenarios or commands and the random command generator 16 for random parameter-driven testcase scenarios or commands to manage the interaction between the sources of commands. The command manager 12 comprises a command queue 22 where the interaction between deterministic commands and random parameter-driven commands are managed and queued for execution in a simulation environment during the verification of a hardware design under test hereinafter referred to as design under test. In other words, the command queue represents the list of commands (both deterministic and random parameter-driven) that are currently registered and ready for execution by the BFM in the simulation environment.

The command manager 12 includes functions that are used to perform this command management scheme. These functions are illustrated in FIG. 1 as functional blocks 30-44. These functional blocks include a QUERY_AND_REGISTER functional block 30, an UNREGISTER functional block 32, a LOCK functional block 34, an UNLOCK functional block 34, a QUERY_AND_MANAGE functional block 36, a SYNCHRONIZE functional block 38, a CANCEL functional block 40, a RANDOM_GENERATOR CONTROL functional block 42, and a BURST_IDLE_CONTROL functional block 44. It is contemplated that the command manager implements other functions other than the methods described herein (e.g., performing this management scheme).

Now turning to the details of each functional block listed above. In the QUERY_AND_REGISTER functional block 30, the command manager 12 queries the testcase port 14 and the random command generator 16 for available commands. More specifically, the command manager 12 queries the testcase port 14 for deterministic commands and the random command generator 16 for random parameter-driven commands. In this QUERY_AND_REGISTER functional block 30, the command manager 12 arbitrates between the two command sources (testcase port and random command generator) and registers the available commands from each source with the command queue 22 where such available commands are queued for execution during the verification of the design under test.

Figure 2:
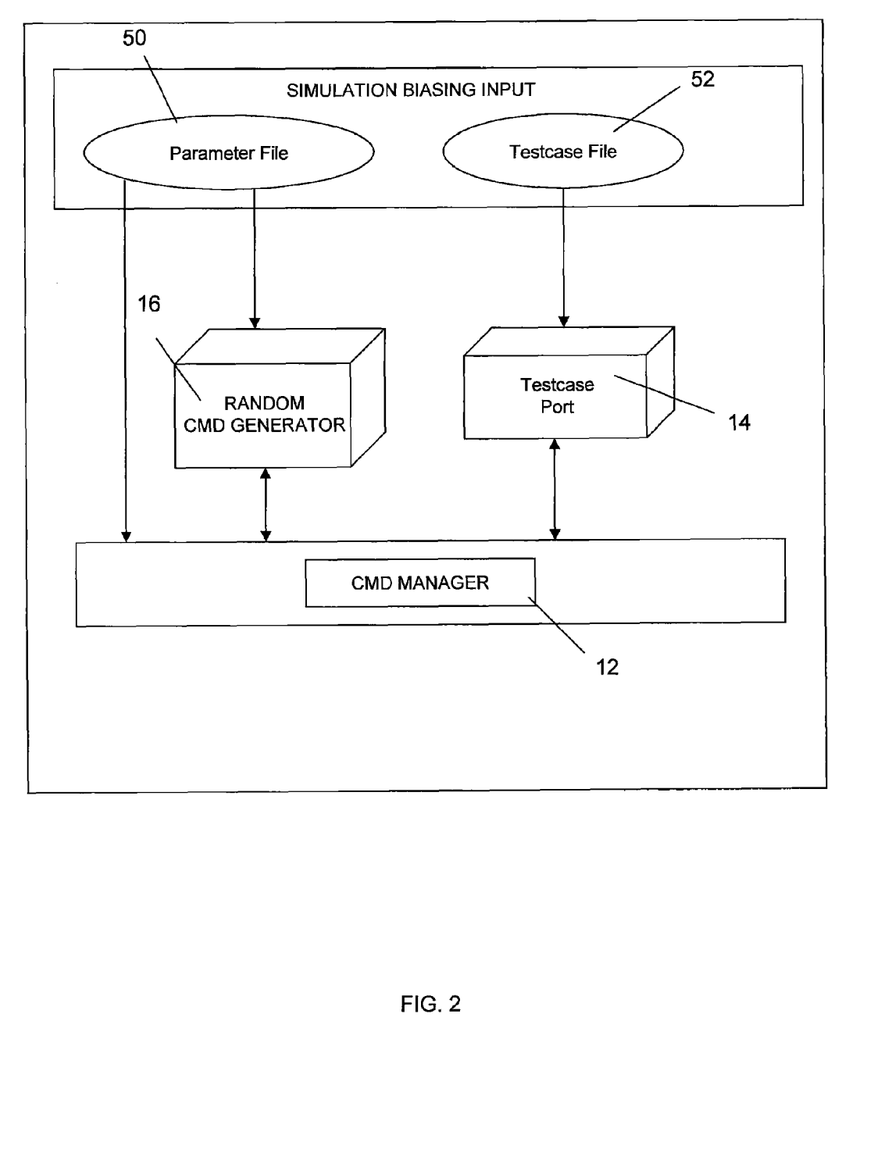
FIG. 2 illustrates a schematic diagram of a random command generator and a testcase port interacting with a command manager within the BFM in accordance with one exemplary embodiment of the present invention.

In accordance with one exemplary embodiment, the random command generator 16 is configured to receive information from a parameter file 50 as illustrated in FIG. 2. In one exemplary embodiment, the parameter file 50 provides random parameter specifications to the random command generator 16 to control and enable the random command generator 16 to generate random parameter-driven commands that verify the functionality of the design under test in accordance with one exemplary embodiment. In accordance with one exemplary embodiment, the random parameter-driven commands are used to verify the majority of the test scenarios and to provide higher test coverage for the design under test. In accordance with one exemplary embodiment, the random parameter specifications dictate the generation of random parameter-driven commands. The random parameter specifications include, for example, read/write length, command type, protocol variations to use while executing the commands, etc. Of course other parameter information used to dictate the generation of the random parameter-driven commands can be used depending on the application.

In accordance with one exemplary embodiment, the parameter file 50 also contains burst idle information that dictates how many random parameter-driven commands will be generated by the random command generator 16 before the random command generator 16 will wait for the existing generated command pool to reach an idle point (e.g., a state where all currently generated random parameter-driven commands have completed). In other words, there are specific intervals or predetermined intervals defined through the parameter file that will direct the random command generator to pause random command generation through the command manager 12. The idle information is read in by the random command generator 16, which is then functionally called and managed by the command manager 12.

In accordance with one exemplary embodiment, the parameter file 50 further includes random biasing stimuli that are sent directly to the command manager 12 to modify or manipulate the random parameter-driven commands in the simulation environment that were provided by the random command generator 16. As such, the random parameter-driven commands in the simulation environment can be modified and manipulated through the random biasing stimuli independently from the deterministic commands. In other words, the random parameter-driven commands in the environment can be modified and manipulated without interrupting the execution of the deterministic commands. Examples of random biasing stimuli include specific weighting or distribution of read or write length to be used for specific types of commands, queue sizes to be used when executing commands, etc.

In accordance with one exemplary embodiment, the testcase port 14 is a manually-driven testcase port configured to receive instructions/commands from a testcase file 52 as illustrated in FIG. 2. The testcase port 14 decodes such instructions from the testcase file 52 into deterministic commands used to verify the functions of the design under test. In one exemplary embodiment, the deterministic commands are used to verify "hard to hit" corner cases or specialized functions in the design under test.

In accordance with one exemplary embodiment, the testcase file 52 contains specific instructions that specify the command type, the command length and the address among other possibilities of a manual or deterministic testcase command. In accordance with one exemplary embodiment, the testcase file 52 may also include synchronization commands that indicate that all previous commands should reach an idle state (e.g., all previous commands should complete) prior to executing subsequent commands in the testcase file 52. In operation, the synchronization commands stops the deterministic commands from being received by the command manager until an idle state is reached within the system. In accordance with one exemplary embodiment, the specific commands are read in by the manually-driven testcase port 14, which are then functionally called and managed by the command manager 12. The testcase file 52 may also include directives for the random command generator 16, which will be described in more detail below.

Now turning back to FIG. 1. In the UNREGISTER functional block 32, the command manager 12 completes the testcase port-driven or randomly generated random parameter-driven command respectively from the testcase port 14 or the random command generator 16 and removes such completed command from the command queue 22. As such, once a command is completed, such command is removed or unregistered from the queue leaving additional space in the command queue 22 for additional commands to be registered with.

In the LOCK functional block 34, the command manager 12 flags specific memory addresses as temporarily inaccessible if directed by the address manager 18. Address locks may be requested by the BFM. This lock function will effectively cause the command manager 12 to hold off commands that access these areas of the memory until the lock function is disabled or the lock is removed. In the UNLOCK functional block 36, the command manager 12 removes a lock that was previously in place.

In accordance with one exemplary embodiment, the address manager 18 is functionally called by the command manager 12 and functions as a central addressing resource. The address manager 18 is used to provide overall real time control and management of simulation addresses within the simulation environment. The address manager 18 intelligently manages, checks and generates all addresses used in the simulation environment. Moreover, the address manager 18 maintains complete visibility to all memory within the environment and how it maps to various resources and devices within the environment. In its address generation role, the address manager 18 is able to generate addresses according to input constraints to target specific resources in the environment and to stimulate various testing scenarios from the deterministic commands and the random parameter-driven commands.

In the QUERY_AND_MANAGE functional block 38, the command manager 12 determines if the commands registered with the command queue 22 have completed and if such commands should be removed from the command queue 22. As such, once the command manager 12 determines that particular commands registered with the command queue 22 have been completed in the QUERY_AND_MANAGE functional block 38, such commands are removed from the command queue 22 in the UNREGISTER functional block 32.

In the SYNCHRONIZATION functional block 40, the command manager 12 communicates with the synchronization manager 20 within the simulation environment to identify when all commands have quiesced and reached an idle condition. This enables testcase synchronization and control to be used in manual testcases while executing in a parameter-driven random generation environment. In accordance with one exemplary embodiment, the synchronization manager 20 is a global device within the simulation environment 10 for identifying when the system has reached an idle state.

In the CANCEL functional block 42, the command manager 12 terminates commands that are in progress and removes them from the command queue when an error condition or terminating condition is detected in the environment. In one exemplary embodiment, the command manager 12 is configured to detect an error condition or terminating condition. Of course, other means for detecting an error condition or terminating condition may be implemented within the BFM.

In accordance with one embodiment, the command manager 12 determines if the deterministic commands from the testcase port 14 contain directives for the random command generator 16. If so, the command manager 12 will perform the directives in the RANDOM_GENERATOR_CONTROL functional block 44 accordingly. The directives include disabling or enabling random generation, disabling specific types of randomization, etc. It is contemplated that the directives can also cause the command manager 12 to modify the generation of the random parameter-driven commands performed by the random command generator 16. In the RANDOM_GENERATOR_CONTROL functional block 44, the command manager 12 communicates this information (directives from deterministic commands) to the random command generator 16. More specifically, the command manager 12 communicates with the random command generator 16 to disable or enable random command generator or disable the generation of specific types of random parameter-driven commands as directed by the deterministic commands in the RANDOM_GENERATOR_CONTROL functional block 44. Disabling, enabling and modifying random generation is advantageous in situations where portions of deterministic commands require randomization to be disabled or quiesced and then re-enabled (such as in hot-plug testing, global flush, global abort or otherwise). It is also advantageous in situations where portions of manual testcases require elimination of some types of randomization (for example, disabling random register writes during a portion of a testcase without disabling all random generation).

In the BURST_IDLE_CONTROL functional block 46, the command manager directs the random command generator 16 to pause random command generation at specific intervals or predetermined intervals defined through the parameter file 50 (e.g., burst idle information). In operation, the command manager 12 monitors the command execution and communicates with the synchronization manager 20 in the simulation environment to indicate when all currently active commands have quiesced and an idle condition has been reached. Once an idle condition has been reached, the command manager 12 re-enables the random command generator 16 if it is not currently disabled by one of the directives from the testcase port 14 until the subsequent burst idle interval occurs. This approach allows idle synchronization to be accommodated within a deterministic testcase.

In accordance with one exemplary embodiment, an idle condition is reached when all existing commands (both deterministic and random parameter-driven) have completed and each source is in an idle state.

Figure 3:
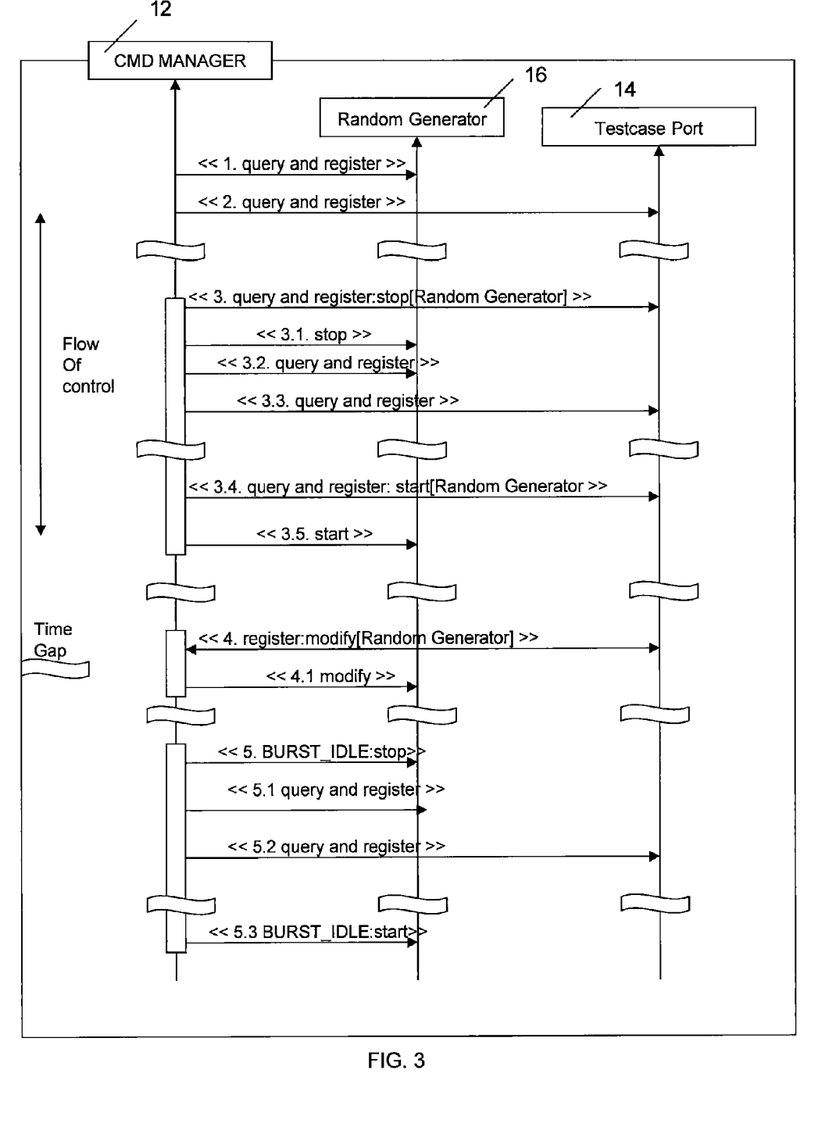
FIG. 3 illustrates a flow diagram of a management scheme between the command manager and the random command generator and the testcase port in accordance with one exemplary embodiment.

FIG. 3 illustrates a flow diagram of the management scheme described above between the command manager 12 and the two sources of stimuli in accordance with one exemplary embodiment. As illustrated in the diagram, the command manager 12 queries and registers commands from both the testcase port 14 and the random command generator 16 as indicated in flow line 1 and 2. The testcase port 14 may include a directive to stop the generation of random parameter-driven commands as indicated in flow line 3. If this directive is detected by the command manager 12 when it queries the testcase port 12, the command manager 12 will communicate to the random command generator 16 to stop generating random commands as indicated in flow line 3.1. Thus, until the random command generator 16 is re-enabled, which is indicated in flow line 3.4 and 3.5, with a start directive, no new random parameter-driven commands will be available when the command manager 12 queries the random command generator 16. The command manager is querying the random command generator 16 and the testcase port 14 for available commands throughout simulation as indicated in flow lines 3.2 and 3.3. Directives from the deterministic commands can also cause the command manager 12 to modify the random command generation performed by the random command generator 16 as indicated in flow lines 4 and 4.1. Also, at the specified burst idle intervals, the command manager can disable command generation by the random command generator 16 as indicated in flow line 5. Once an idle condition is reached, the command manager 12 will re-enable the command generation by the random command generator 16 as indicated in flow line 5.3. The command manager is querying the random command generator 16 and the testcase port 14 for available commands throughout simulation as indicated in flow lines 5.1 and 5.2.

Figure 4:
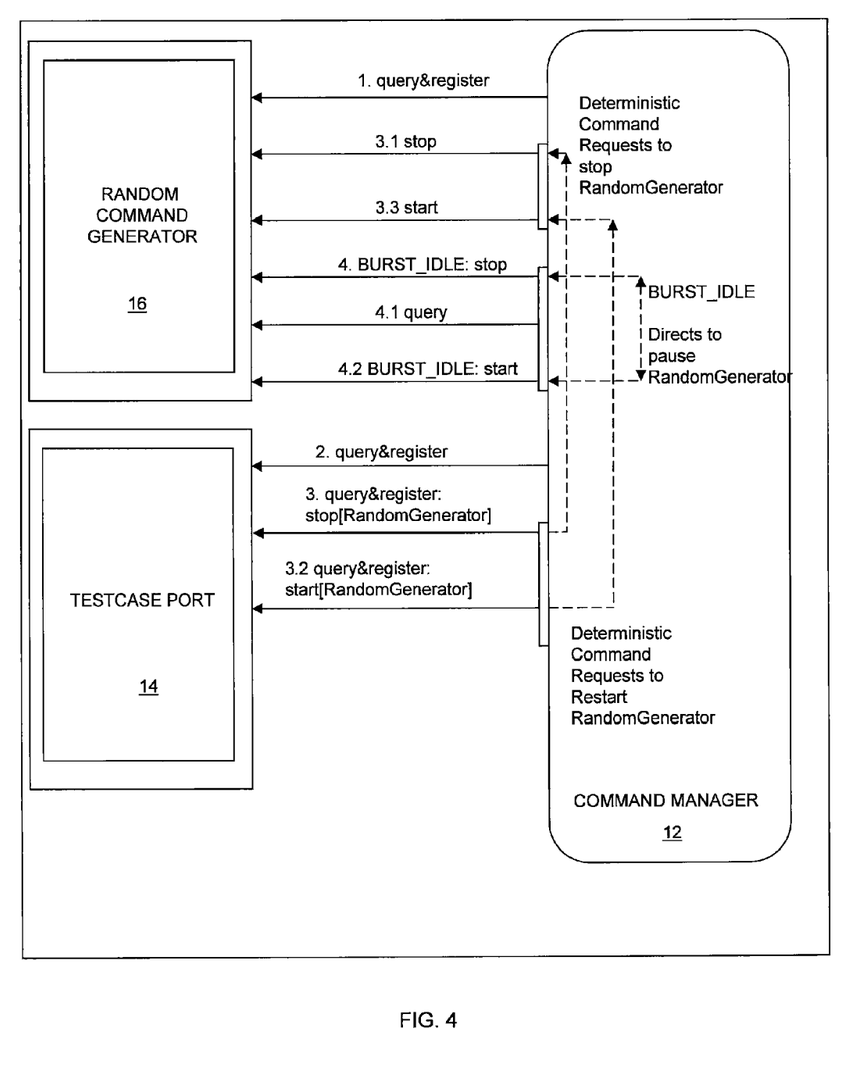
FIG. 4 illustrates a schematic diagram on how random parameter-driven commands and deterministic commands operate independently with the command manager in a simulation environment in accordance with one exemplary embodiment.

FIG. 4 illustrates a schematic diagram on how the random parameter-driven commands and deterministic commands operate independently with the command manager 12 in the simulation environment. Directives, if any, from the testcase port 14 are communicated to the random command generator 16 through the command manager 12 in the QUERY_AND_REGISTER functional block 30. The testcase port 14 and the random command generator 16 are queried by the command manager 12 throughout simulation for available testcase commands (arrow 1 and 2). When a directive to start, stop or modify the behavior of the generation of the random parameter-driven commands is received from the testcase port 14, the command manager 12 directs the random command generator 16 to quiesce, modify or restart random generation as directed (arrow 3, 3.1, 3.2, and 3.3). In addition, the command manager 12 will direct the random command generator 16 to quiesce at specified burst idle intervals (arrow 4), monitor the random generator for an idle condition to synchronize with the synchronization manager 20 (arrow 4.1) and then restart random generation (arrow 4.2).

It is contemplated that in a simulation environment with multiple instances each BFM will include a command manager and therefore be capable of driving random parameter-driven stimuli along with any deterministic testcase-port driven stimulus specified in a deterministic testcase file.

Advantageously, the targeted test scenarios can be verified in a parameter-driven random on-the-fly environment without modifying the targeted testcases. In addition, the randomization biases (e.g., cache sizes to be modeled within the BFM, read/write lengths, etc.) in the environment are able to be modified and manipulated independently form the targeted testcases. Thus, the targeted testcases can be exercised without modification in a variety of random environments having different randomization biases. Exemplary embodiments of the present invention also result in the eliminating the need to create multiple versions of the targeted testcases to accommodate the changes in biases of the random environment.

In addition, exemplary embodiments of the present invention allow the parameter-driven randomly generated commands to be used with targeted testcases that include synchronization commands. Exemplary embodiments of the present invention permit the command manager 12 to execute synchronization commands of the deterministic commands along with the random parameter-driven commands in the same simulation environment. As such, the traffic generated in the simulation environment contains both deterministic commands and random parameter-driven commands.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for allowing simultaneous parameter-driven and deterministic simulation during verification of a hardware design, the method comprising:
    enabling a plurality of random parameter-driven commands from a random command generator to execute in a simulation environment during verification of the hardware design through a command managing device;
    enabling a plurality of deterministic commands from a manually-driven testcase port to execute in the simulation environment simultaneously with the plurality of random parameter-driven commands during verification of the hardware design through the command managing device, the plurality of deterministic commands and the plurality of random parameter-driven commands each verify the functionality of the hardware design;
    enabling a parameter file in signal communication with the command managing device, the parameter file includes random biasing stimuli for modifying or manipulating the plurality of random parameter-driven commands in the simulation environment independently from the plurality of deterministic commands without interrupting the execution of the plurality of deterministic commands; and
    enabling a testcase file having instructions that are read and decoded by the manually-driven testcase port for generating the deterministic commands.

2. The method as in claim 1, wherein the command managing device enables the execution of one or more synchronization commands of the plurality of deterministic commands in the simulation environment, the one or more synchronization commands stops the plurality of deterministic commands from being received by the command managing device until an idle condition is reached.

3. The method as in claim 2, wherein the idle condition is reached when the plurality of deterministic commands previously decoded and received by the command managing device are completed, the random command generator is paused, temporarily preventing the random command generator from generating additional random parameter-driven commands, and the plurality of parameter-driven random commands in the simulation environment are completed.

4. The method as in claim 1, wherein the command managing device directs the random command generator to pause random generation at specified intervals, the random command generator remains paused until an idle condition is reached, and the command manager is configured to re-enable the random command generator once the idle condition is reached.

5. The method as in claim 4, wherein the idle condition is reached when the plurality of deterministic commands previously decoded and received by the command managing device are completed, the random command generator is paused, temporarily preventing the random command generator from generating additional random parameter-driven commands, and the plurality of parameter-driven random commands in the simulation environment are completed.

6. The method as in claim 4, wherein the plurality of parameter-driven random commands include burst idle information that dictates how many of the plurality of parameter-driven random commands will be generated before the random command generator will wait for the idle condition to be reached.

7. The method as in claim 1, wherein the random command generator is configured to receive random parameter specifications for controlling and enabling the generation of the plurality of parameter-driven random commands.

8. The method as in claim 1, wherein the command managing device enables the plurality of deterministic commands to enable, disable, or modify the generation of the plurality of parameter-driven random commands during the execution of the plurality of deterministic commands.

9. A system for allowing simultaneous parameter-driven and deterministic simulation during verification of a hardware design under test, the system comprising:
    a command managing device configured to manage the simultaneous execution of a plurality of random parameter-driven commands and a plurality of deterministic commands in a simulation environment during verification of the hardware design under test;
    a random command generator that operably interacts with the command managing device, the random command generator generates the plurality of random parameter-driven commands;
    a manually-driven testcase port that operably interacts with the command managing device, the manually-driven testcase port generates the plurality of deterministic commands
    a parameter file in signal communication with the command managing device, the parameter file includes random biasing stimuli for modifying or manipulating the plurality of random parameter-driven commands in the simulation environment independently from the plurality of deterministic commands without interrupting the execution of the plurality of deterministic commands; and
    a testcase file having instructions that are read and decoded by the manually-driven testcase port for generating the deterministic commands.

10. The system as in claim 9, wherein the command managing device enables the execution of one or more synchronization commands of the plurality of deterministic commands in the simulation environment, the one or more synchronization commands stops the plurality of deterministic commands from being received by the command managing device until an idle condition is reached.

11. The system as in claim 10, wherein the idle condition is reached when the plurality of deterministic commands previously decoded and received by the command managing device are completed, the random command generator is in the idle state, and the plurality of random parameter-driven commands in the parameter-driven random generation environment are completed.

12. The system as in claim 9, wherein the command managing device directs the random command generator to pause random generation at specified intervals, the random command generator remains paused until an idle condition is reached, and the command managing device is configured to re-enable the random command generator once the idle condition is reached.

13. The system as in claim 12, wherein the idle condition is reached when the plurality of deterministic commands previously decoded and received by the command managing device are completed, the random command generator is in the idle state, and the plurality of random parameter-driven commands in the parameter-driven random generation environment are completed.

14. The system as in claim 12, wherein the plurality of random parameter-driven commands include burst idle information that dictates how many of the random parameter-driven commands will be generated before the random command generator will wait for the idle condition to be reached.

15. The system as in claim 9, wherein the command managing device enables the plurality of deterministic commands to enable, disable, or modify the generation of the plurality of random parameter-driven commands during the execution of the plurality of deterministic commands.

* * * * *